United States Patent [19]
Li et al.

[11] Patent Number: 5,877,979
[45] Date of Patent: Mar. 2, 1999

[54] SINGLE-SIDED RAM CELL AND METHOD OF ACCESSING SAME

[75] Inventors: Richard C. Li, Cupertino; Hy V. Nguyen, San Jose; Scott S. Nance, Sunnyvale, all of Calif.

[73] Assignee: Xilinx, Inc., San Jose, Calif.

[21] Appl. No.: 884,369

[22] Filed: Jun. 26, 1997

[51] Int. Cl.$^6$ .................................................. G11C 11/00
[52] U.S. Cl. .......................................... 365/154; 365/156
[58] Field of Search ...................................... 365/154, 156, 365/190, 191

[56] References Cited

U.S. PATENT DOCUMENTS

| | | | |
|---|---|---|---|
| 5,353,248 | 10/1994 | Gupta | 365/154 |
| 5,353,251 | 10/1994 | Uratani | 365/154 |
| 5,475,638 | 12/1995 | Anami | 365/154 |

*Primary Examiner*—David C. Nelms
*Assistant Examiner*—Son Mai
*Attorney, Agent, or Firm*—E. Eric Hoffman; Jeanette S. Harms

[57] ABSTRACT

A memory system having a single-sided memory cell, a first voltage supply terminal and a control circuit is provided. The single-sided memory cell has a first node and a second node. Data values are written to the memory cell by selectively applying data signals to the first node or the second node, and data values are read from the memory cell from the second node. The control circuit is coupled to receive a data signal having one of a first state and a second state. The control circuit couples the first node of the memory cell to the first voltage supply terminal when the data signal is in the first state, thereby writing a first data value to the memory cell. The control circuit couples the second node of the memory cell to the first voltage supply terminal when the data signal is in the second state, thereby writing a second data value to the memory cell. Because the first voltage supply terminal is used to write both the first and second data values to the memory cell, problems associated with inadequate write voltages are eliminated by appropriate selection of the first supply voltage.

11 Claims, 5 Drawing Sheets

SINGLE-SIDED RAM CELL AND METHOD OF ACCESSING SAME

BACKGROUND OF THE INVENTION

1. Field of the Invention

The present invention relates to a single-sided random access memory (RAM) cell and a method of writing data values to the same.

2. Discussion of Related Art

FIG. 1 is a circuit diagram of a conventional single-sided five transistor RAM cell 100 which is commonly used in integrated circuits such as field programmable gate arrays (FPGAs). As used herein, a single-sided RAM cell is a RAM cell which is accessed by a single line during a write operation, and which is accessed by a single line during a read operation. Single-sided RAM cell 100 includes n-channel access transistor 101, p-channel transistors 102–103, and n-channel transistors 104–105. P-channel transistor 102 and n-channel transistor 104 are coupled between the $V_{cc}$ and ground voltage supplies as illustrated to form a first inverter 106. Similarly, p-channel transistor 103 and n-channel transistor 105 are coupled between the $V_{cc}$ and ground voltage supplies to form a second inverter 107. Inverters 106 and 107 are cross-coupled to form data latch 108. The output terminal of first inverter 106 and the input terminal of second inverter 107 are connected at node N1. Node N1 is also connected to the drain of access transistor 101. The output terminal of second inverter 107 and the input terminal of first inverter 106 are connected at node N2. Node N2 provides the output signal of RAM cell 100.

A data value is written to RAM cell 100 by asserting a logic high write control signal W on the gate of access transistor 101, thereby turning on transistor 101. When access transistor 101 is turned on, a data value $D_{IN}$ is applied to the source of access transistor 101. The data value $D_{IN}$ is thereby routed through access transistor 101 and applied to node N1.

RAM cell 100 can be in a logic high state or a logic low state. In the logic low state, node N1 is at a logic low voltage (i.e., n-channel transistor 104 is turned on and p-channel transistor 102 is turned off), and node N2 is at a logic high voltage (i.e., p-channel transistor 103 is turned on and n-channel transistor 105 is turned off). In the logic high state, node N1 is at a logic high voltage (i.e., p-channel transistor 102 is turned on and n-channel transistor 104 is turned off), and node N2 is at a logic low voltage (i.e., n-channel transistor 105 is turned on and p-channel transistor 103 is turned off).

To write a logic 1 value to RAM cell 100 while RAM cell 100 is in a logic low state, the write control signal W is asserted high, and a logic high data value $D_{IN}$ is applied to the source of access transistor 101. The logic high data value $D_{IN}$ typically has a voltage of Vcc. At low operating voltages, $V_{cc}$ (and therefore $D_{IN}$) can be less than 2.5 Volts. Under these conditions, a relatively small voltage is developed across n-channel transistor 104, since the voltage developed across n-channel transistor 104 is equal to the voltage of $D_{IN}$ (e.g., 2.5 Volts) minus the threshold voltage drop across access transistor 101 (e.g., 1 volt). Consequently, for low operating voltages, the voltage developed across n-channel transistor 104 may be insufficient to reliably cause RAM cell 100 to transition from a logic low state to a logic high state. That is, the voltage across n-channel transistor 104 may be insufficient to pull node N1 up high enough to turn on n-channel transistor 105. If transistor 101 is fabricated using a deep sub-micron process, the n-channel threshold voltage does not scale down with the decrease in the operation voltage, thereby further exacerbating the problem.

Writing a logic low data value $D_{IN}$ to RAM cell 100 is relatively easy because a logic low data value $D_{IN}$ does not experience a threshold voltage drop across access transistor 101. As a result, the logic low voltage applied to node N1 readily causes p-channel transistor 103 to turn on, thereby causing RAM cell 100 to enter a logic low state.

FIG. 2 is a circuit diagram of a conventional writing-decoding system 200 for use with sixteen single-sided RAM cells 100A–100P. Each of single-sided RAM cells 100A–100P includes a corresponding access transistor 101A–101P and a corresponding data latch 108A–108P. Each of single-sided RAM cells 100A–100P is identical to previously described single-sided RAM cell 100 (FIG. 1). Writing-decoding system 200 further includes access transistors 201–221 and inverters 231–239 as illustrated. Address signals A7–A0 are applied to inverters 231–238, respectively. Data input signal $D_{IN}$ is routed through access transistor 221 to inverter 239 when the write enable signal W is asserted high. The output signal of inverter 239 is provided to each of access transistors. 201–204. One of the address signals A7–A4 is asserted low, thereby causing the output signal from inverter 239 to be routed through one of access transistors 201–204. Each of access transistors 201–204 is coupled to four corresponding access transistors. For example in this embodiment, access transistor 201 is coupled to access transistors 205–208, access transistor 202 is coupled to access transistors 209–212, access transistor 203 is coupled to access transistors 213–216, and access transistor 204 is coupled to access transistors 217–220. Each of access transistors 205–220 is coupled to a corresponding RAM cell 100A–100P. One of the address signals A3–A0 is asserted low, thereby causing the output signal provided by inverter 239 to be routed to one of memory cells 100A–100P. The write select signal WS is asserted high to provide access to a first node (i.e., node N1 of FIG. 1) within each of memory cells 100A–100P. Thus, RAM cell 100A is addressed by setting address signals A7–A0 to 01110111, respectively, and setting the signal WS to 1. The $D_{IN}$ signal is stored in the addressed RAM cell in the manner previously described in reference to FIG. 1. However, decoding-address system 200 fails to remedy the difficulties encountered when writing a logic high data value to a single-sided RAM cell which is currently in a logic low state.

FIG. 3 is a circuit diagram of a conventional double-sided static RAM (SRAM) cell 200. As used herein, a double-sided memory cell is a memory cell which is written by a pair of input lines, and which is read by a pair of output lines. The input lines can be common with the output lines. Because double-sided SRAM cell 200 includes elements similar to RAM cell 100, similar elements in FIGS. 1 and 3 are labeled with similar reference numbers. Thus, in addition to n-channel access transistor 101, p-channel transistors 102–103 and n-channel transistors 104–105, SRAM cell 200 includes a second n-channel access transistor 201. Data values are written to SRAM cell 200 by asserting a logic high control signal W on the gates of access transistors 101 and 201, and providing a data value $D_{IN}$ and a complementary data value $D_{IN}$ bar to the sources of access transistors 101 and 201, respectively. Because a logic low value is always applied to either node N1 or node N2 during a write operation, SRAM cell 200 easily transitions between logic states. However, the second access transistor 201 causes double-sided SRA cell 200 to have a greater layout area than single-sided RAM cell 100.

It would therefore be desirable to have a single-sided memory cell which is capable of being reliably written, regardless of the current state of the memory cell and the value of the data value being written to the memory cell.

SUMMARY

Accordingly, the present invention provides a memory system which includes a single-sided memory cell and a write access control circuit. The single-sided memory cell has a first node and a second node. A data value is written to the memory cell by selectively connecting the first node or the second node to a voltage supply terminal. Only one of the first and second nodes is coupled to the voltage supply terminal during any given write operation. In a particular embodiment, the voltage supply terminal is a ground voltage supply terminal.

To write a logic high data value to the single-sided memory cell, the write access control circuit is controlled to couple the voltage supply terminal to the first node of the memory cell. Conversely, to write a logic low data value to the single-sided memory cell, the write access control circuit is controlled to couple the voltage supply terminal to the second node of the single-sided memory cell. In a particular embodiment, the write access control circuit couples a ground voltage supply terminal to the first and second nodes through n-channel field effect transistors. Because the writing of both logic high and logic low data values involves the routing of a ground voltage through an n-channel transistor, an adequate write voltage will always be provided to the single-sided memory cell, regardless of the state of the data value currently stored in the memory cell.

The present invention further includes a method of operating a single-sided memory cell which includes the steps of: (1) coupling a first node of the single-sided memory cell to a first voltage supply to write a data value having a first logical state to the single-sided memory cell, and (2) coupling a second node of the single-sided memory cell to the first voltage supply to write a data value having a second logical state to the single-sided memory cell.

The present invention will be more fully understood in view of the following description and drawings.

DETAILED DESCRIPTION

Figure 1:
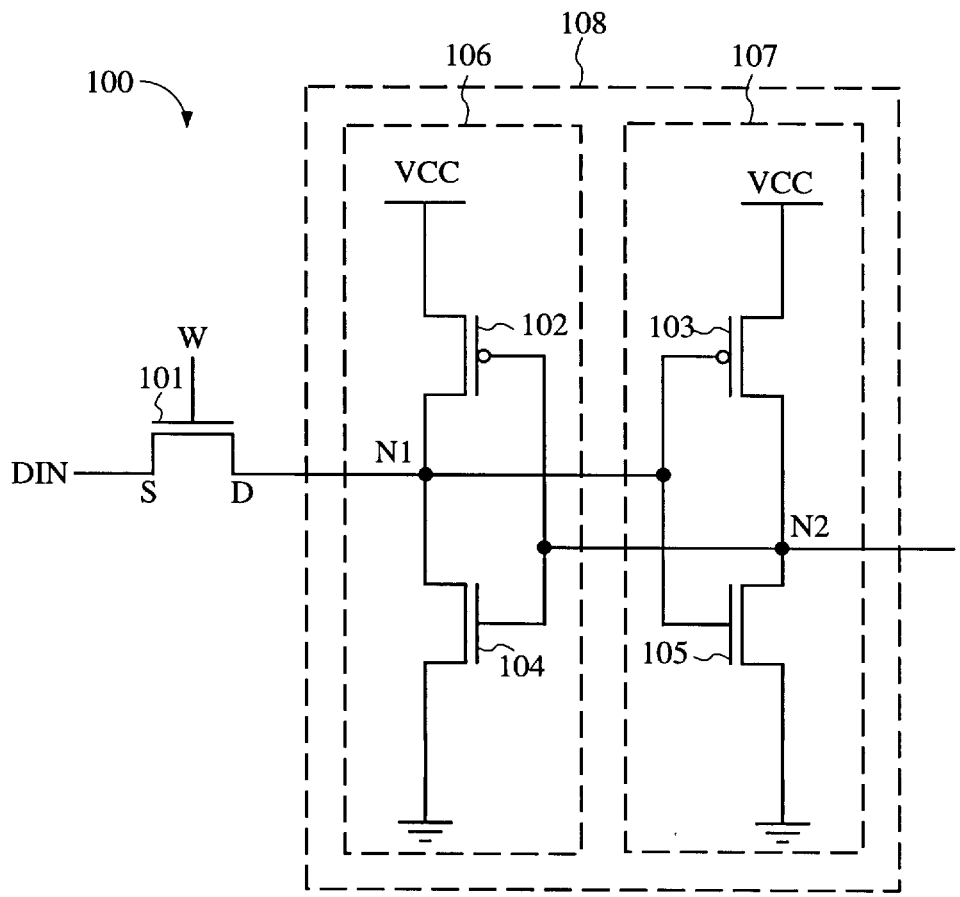
FIG. 1 is a circuit diagram of a conventional single-sided RAM cell.
Figure 2:
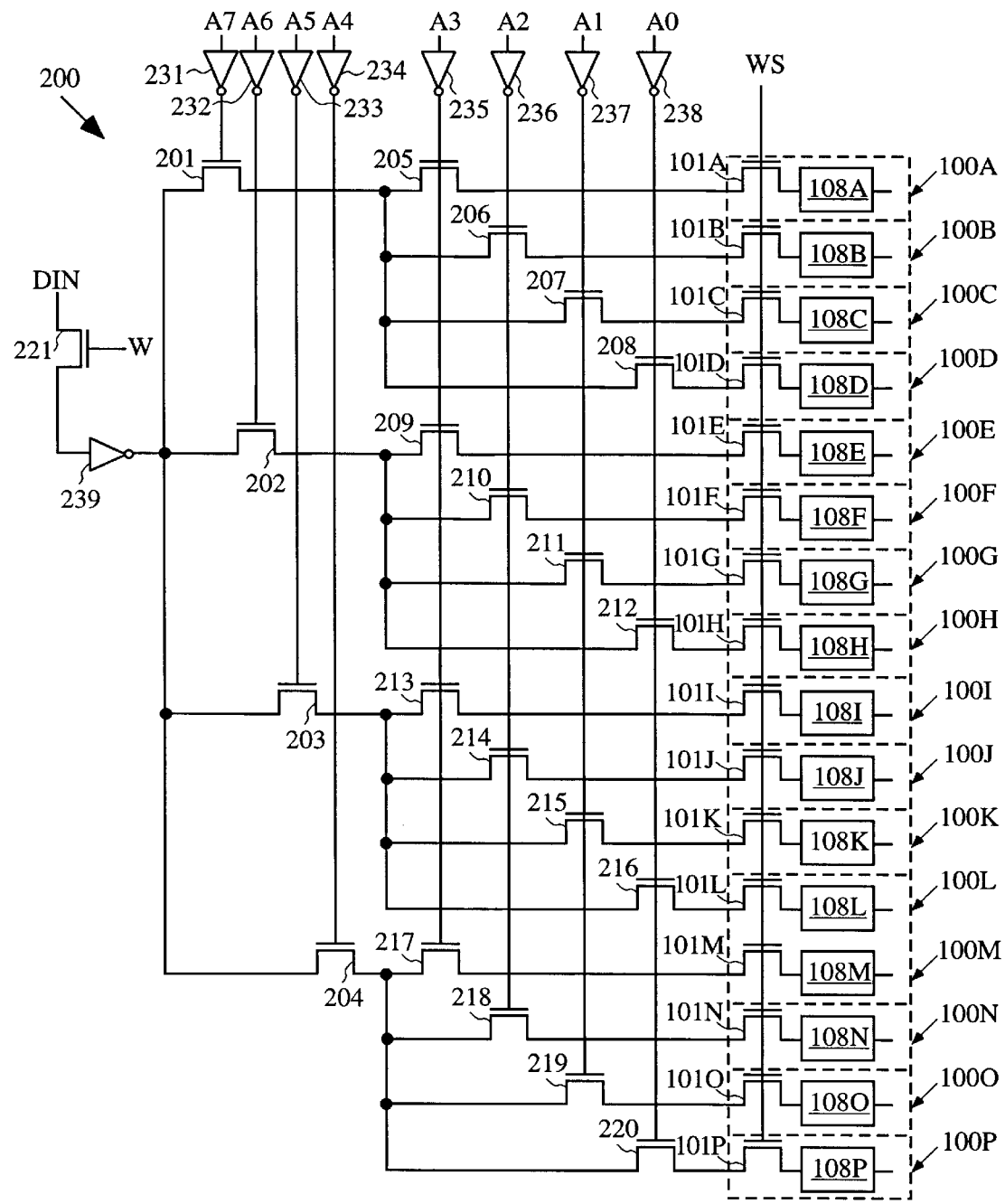
FIG. 2 is a circuit diagram of a conventional circuit used for addressing a plurality of single-sided RAM cells.
Figure 3:
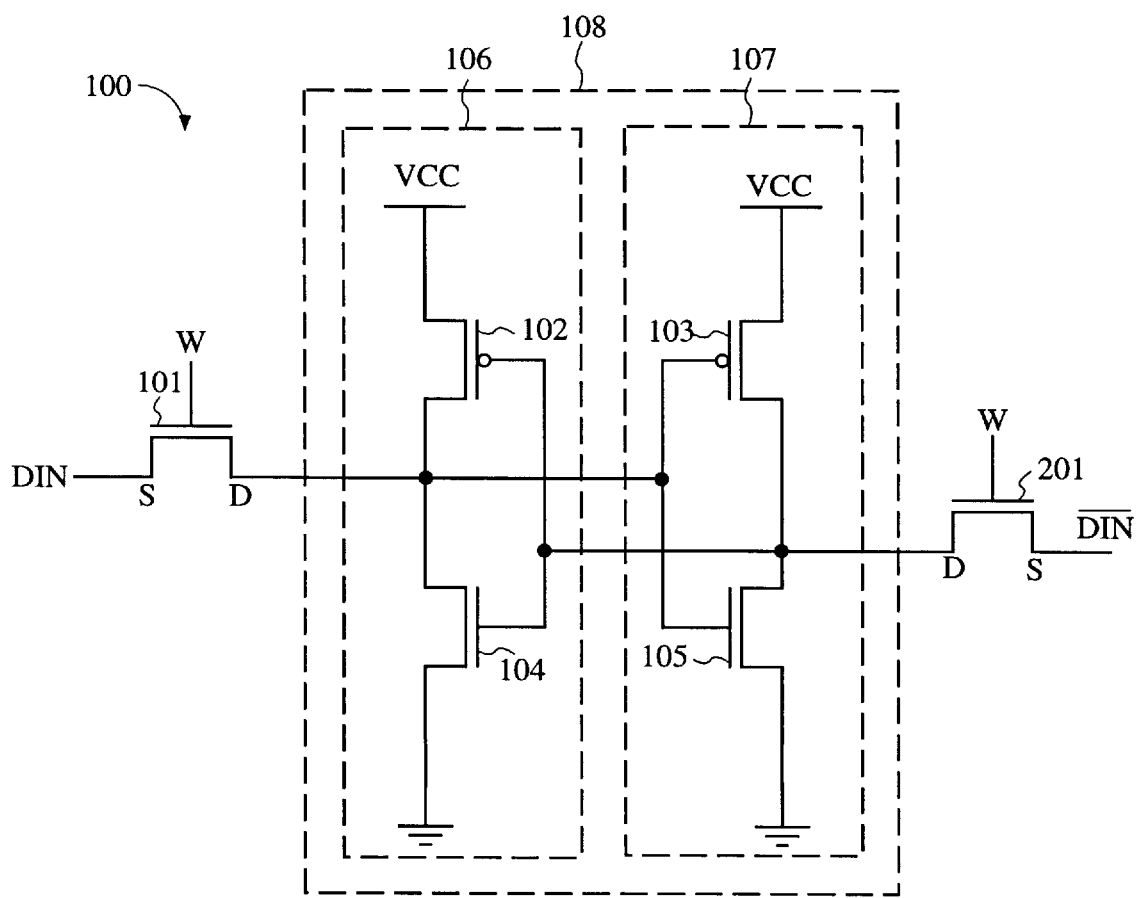
FIG. 3 is a circuit diagram of a conventional double-sided SRAM cell.
Figure 4:
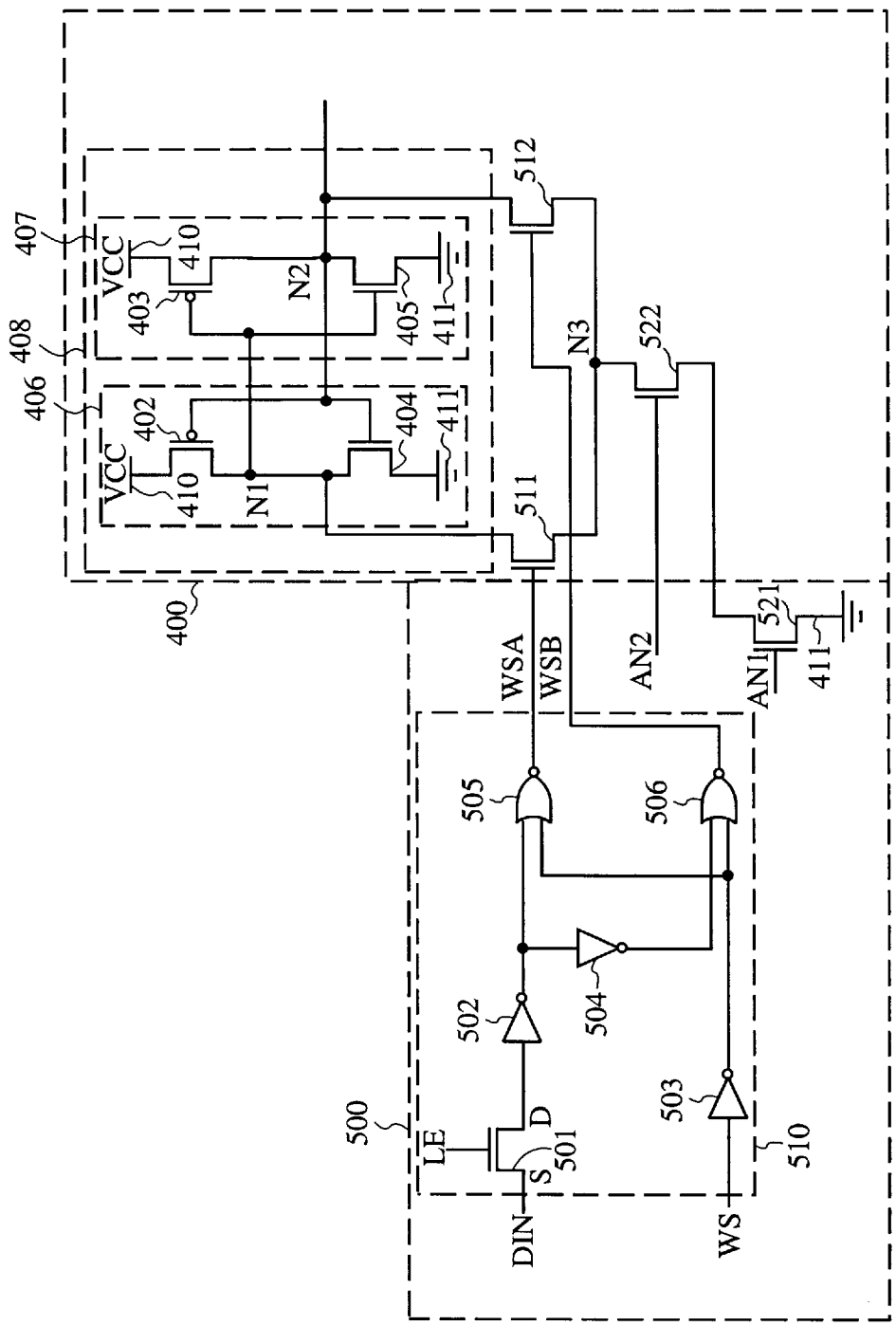
FIG. 4 is a circuit diagram of a memory system which includes a single-sided RAM cell in accordance with one embodiment of the present invention.

FIG. 4 is a circuit diagram of a memory system which includes a single-sided RAM cell 400 and an associated write access control circuit 500 in accordance with one embodiment of the present invention. RAM cell 400 includes p-channel transistors 402–403 and n-channel transistors 404–405. P-channel transistor 402 and n-channel transistor 404 are connected in series between $V_{cc}$ voltage supply terminal 410 and ground voltage supply terminal 411, thereby forming a first inverter 406. Similarly, p-channel transistor 403 and n-channel transistor 405 are connected in series between $V_{cc}$ voltage supply terminal 410 and ground voltage supply terminal 411, thereby forming a second inverter 407. During normal operating conditions, $V_{cc}$ voltage supply terminal 410 is coupled to receive a positive supply voltage (e.g., 3 volts, 5 volts), and ground voltage supply terminal 411 is coupled to receive a ground supply voltage (e.g., 0 volts).

The first and second inverters 406, 407 are cross-coupled to form a data latch 408. More specifically, the output terminal of first inverter 406 is coupled to the input terminal of second inverter 407 at first node N1, and the output terminal of second inverter 407 is coupled to the input terminal of first inverter 406 at second node N2.

RAM cell 400 further includes n-channel write access control transistors 511 and 512, and second-level access transistor 522. The drains of n-channel write access control transistors 511 and 512 are coupled to node N1 and node N2, respectively. The sources of write access control transistors 511 and 512 are coupled to a common node N3. Second-level access transistor 522 is connected in series between node N3 and first-level access transistor 521.

Access control circuit 500 includes n-channel access transistor 501, inverters 502–504, NOR logic gates 505–506, and first-level n-channel access transistor 521. The gates of write access control transistors 511 and 512 are connected to the output terminals of NOR gates 505 and 506, respectively. The gate of second-level access transistor 522 is connected to receive address signal AN2. First-level access transistor 521 is connected in series between second-level access transistor 522 and the ground voltage supply terminal 411. The gate of first-level access transistor 521 is connected to receive address signal AN1.

As described in more detail below, during each write access to memory cell 400, write access control transistors 511–512, first-level access transistor 521 and second-level access transistor 522 are controlled to selectively couple the ground voltage supply terminal 411 to either node N1 or node N2, thereby writing a logic low value or a logic high value, respectively, to memory cell 400.

Access control circuit 500 is further connected to receive an input data signal $D_{IN}$, as well as a write select (WS) signal. The signal $D_{IN}$ is provided to a source of access transistor 501. The drain of access transistor 501 is coupled to the input terminal of inverter 502, and the gate of access transistor 501 is coupled to receive an access control signal LE. The output terminal of inverter 502 is coupled to an input terminal of NOR gate 505 and to the input terminal of inverter 504. The output terminal of inverter 504 is coupled to an input terminal of NOR gate 506. The signal WS is provided to the input terminal of inverter 503. The output terminal of inverter 503 is connected to the input terminals of NOR gates 505 and 506.

Access transistor 501, inverters 502–504, and NOR gates 505–506 form an access control signal generator 510. Access control signal generator 510 operates as follows. When no data value is to be written to memory cell 400, the WS signal is de-asserted low. As a result, logic high values are provided to the input terminals of NOR gates 505 and 506 (through inverter 503). In response, NOR gates 505 and 506 provide output signals having a logic low value, thereby turning off write access control transistors 511 and 512 and effectively isolating memory cell 400. In this manner, the data value previously stored in memory cell 400 remains in memory cell 400.

When a data value is to be written to memory cell 400, the WS, LE, AN1 and AN2 signals are all asserted high. The logic high signal WS causes inverter 503 to provide logic low values to input terminals of NOR gates 505 and 506. Consequently, the output signals provided by NOR gates 505 and 506 are dependent upon the values applied to the other input terminals of NOR gates 505 and 506. More specifically, the output signals provided by NOR gates 505 and 506 are dependent upon the value of the input data signal $D_{IN}$. The logic high signal LE causes the signal $D_{IN}$ to be provided to the input terminal of inverter 502. The inverted signal $D_{IN}$ ($D_{IN}$ bar) is provided to an input terminal of NOR gate 505. As a result, NOR gate 505 provides an access control signal WSA which has the same logic state as the $D_{IN}$ signal. In addition, the inverted signal $D_{IN}$ ($D_{IN}$ bar) is provided to the input terminal of inverter 504. As a result, the signal $D_{IN}$ is provided to an input terminal of NOR gate 506. In response, NOR gate 506 provides an access control signal WSB which has the same logic state as the signal $D_{IN}$ bar. The WSA and WSB signals cause one of write access control transistors 511–512 to turn on, and the other one of write access control transistors 511–512 to turn off.

The logic high signals AN1 and AN2 cause first-level access transistor 521 and second-level access transistor 522 to turn on, respectively. The AN1 and AN2 signals are address signals which are described in more detail below in connection with FIG. 5. When both first-level access transistor 521 and second-level access transistor 522 are turned on, a conductive path will exist between one of nodes N1 and N2 and the ground voltage supply terminal 411. The conductive path between node N1 and ground voltage supply terminal 411 will exist through turned on transistors 511, 521, and 522. Similarly, the conductive path between node N2 and ground voltage supply terminal 411 will exist through turned on transistors 512, 521 and 522.

The node which is connected to the ground supply voltage terminal 411 during a write operation is selected in response to the input data signal $D_{IN}$. For example, if the signal $D_{IN}$ has a logic low value, then write access control transistor 512 is turned on, thereby forming a conductive path between node N2 and ground voltage supply terminal 411. Under these conditions, a logic high value is written into memory cell 400 (i.e., node N2 is at a logic low value and node N1 has a logic high value).

Conversely, if the signal $D_{IN}$ has a logic high value, then write access control transistor 511 is turned on, thereby forming a conductive path between node N1 and ground voltage supply terminal 411. Under these conditions, a logic low value is written into memory cell 400 (i.e., node N1 is at a logic low value and node N2 is at a logic high value). During either of the two possible write access conditions, a logic low value is provided to one and only one of nodes N1 and N2. Because all write operations are performed in response to a logic low value, there is no problem establishing voltages sufficient to write data values of either polarity into single-sided memory cell 400.

Figure 5:
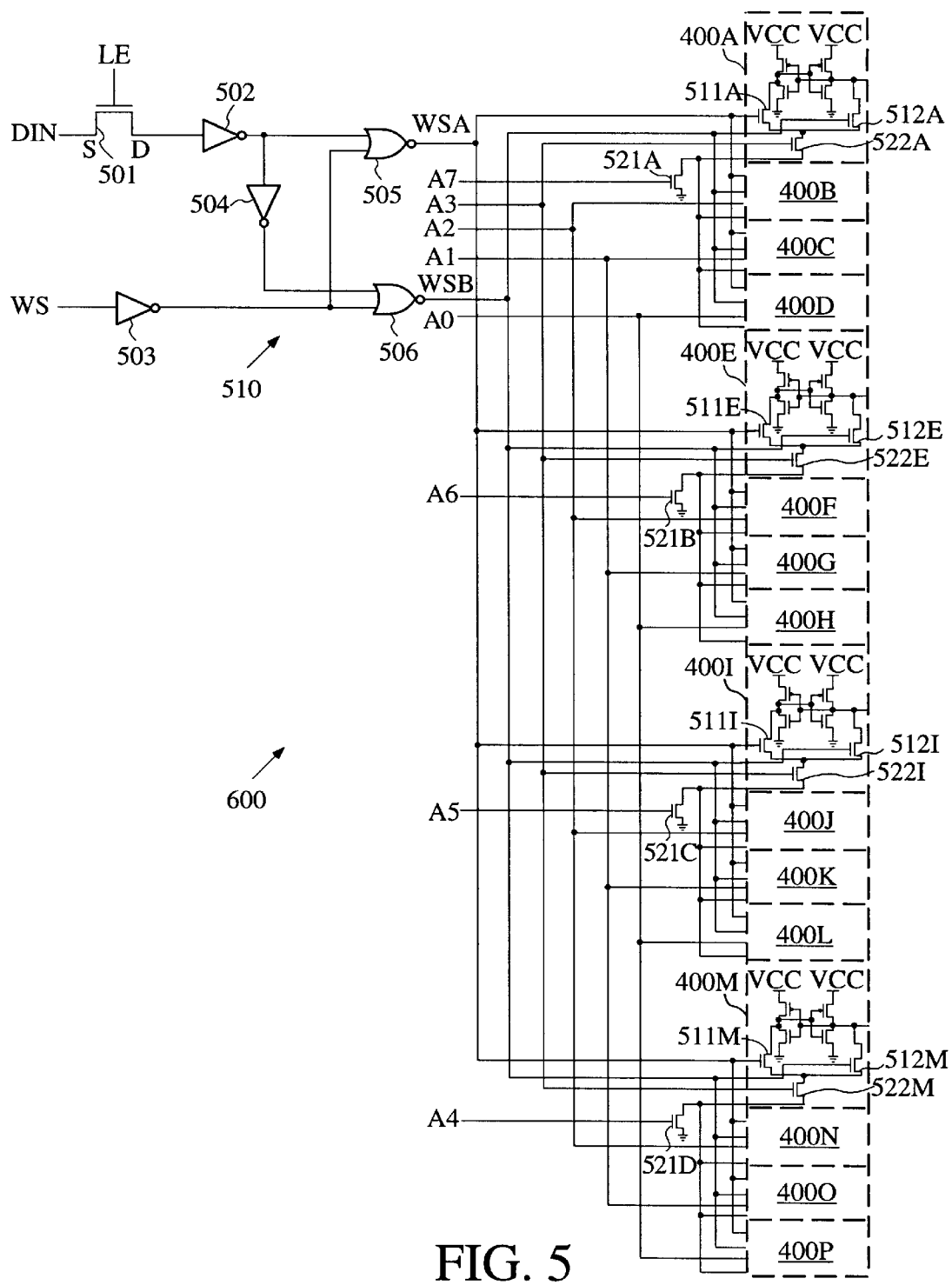
FIG. 5 is a circuit diagram of a decoding circuit used to address a plurality of single-sided RAM cells in accordance with one embodiment of the present invention.

FIG. 5 is a circuit diagram of an addressing circuit 600 which accesses sixteen memory cells 400A–400P, each of which is identical to memory cell 400. Each of memory cells 400A–400P includes access transistors similar to write access control transistors 511, 512, and second-level access transistor 522. For example, memory cell 400A includes access transistors 511A, 512A, and 522A, memory cell 400E includes access transistors 511E, 512E, and 522E, memory cell 400I includes access transistors 511I, 512I, and 522I, and memory cell 400M includes access transistors 511M, 512M, and 522M, as illustrated.

Each group of four memory cells (i.e., 400A–400D, 400E–400H, 400I–400L and 400M–400P) includes a common access transistor similar to first-level access transistor 521. For example, memory cells 400A–400D share a common first-level access transistor 521A, memory cells 400E–400H share a common first-level access transistor 521B, memory cells 400I–400L share a common first-level access transistor 521C, and memory cells 400M–400P share a common first-level access transistor 521D. Access control signal generator 510 is common to memory cells 400A–400P.

The sixteen memory cells 400A–400P are addressed in response to eight address bits A7–AO. Address bits A7, A6, A5, and A4 are provided to first-level access transistors 521A, 521B, 521C, and 521D, respectively. In this embodiment, only one of address bits A7, A6, A5, and A4 is asserted at any given time. When first-level access transistor 521A is turned on, it is possible for any one of the four memory cells 400A–400D to be coupled to the ground voltage supply rail 411. Similarly, when first-level access transistor 521B, 521C, or 521D is turned on, it is possible for memory cells 400E–400H, 400I–400L, or 400M–400P, respectively, to be coupled to the ground voltage supply rail 411.

Address signal A3 is coupled to second-level access transistors 522A, 522E, 522I, and 522M in memory cells 400A, 400E, 400I, and 400M, respectively. When asserted, address signal A3 enables each of the second-level access transistors 522A, 522E, 522I, and 522M.

Address signal A2 is coupled to second-level access transistors (not shown) in memory cells 400B, 400F, 400J, and 400N. When asserted, address signal A2 enables each of the second-level access transistors in memory cells 400A, 400E, 400I, and 400M.

Address signal A1 is coupled to second-level access transistors (not shown) in memory cells 400C, 400G, 400K, and 400O. When asserted, address signal A1 enables each of the second-level access transistors in memory cells 400C, 400G, 400K, and 400O.

Address signal A0 is coupled to second-level access transistors (not shown) in memory cells 400D, 400H, 400L and 400P. When asserted, address signal AO enables each of the second-level access transistors in memory cells 400D, 400H, 400L and 400P.

The write control transistors in each of memory cells 400A–400P are coupled to receive the control signals WSA and WSB generated by access control signal generator 510. For example, write control transistors 511A and 512A in memory cell 400A are coupled to receive the control signals WSA and WSB, respectively. Write control transistors 511E and 512E in memory cell 400E are coupled to receive the control signals WSA and WSB, respectively. Write control transistors 511I and 512I in memory cell 400I are coupled to receive the control signals WSA and WSB, respectively. Write control transistors 511M and 512M in memory cell 400M are coupled to receive the control signals WSA and WSB, respectively. Access control signal generator 510 operates in the manner previously described in connection with FIG. 4.

Memory cell 400A is accessed in the following manner. Address signals A7–AO are set to a value of 1000 1000, thereby turning on first-level access transistor 521A and second-level transistor 522A. The signals LE and WS are asserted high, thereby enabling access control signal generator 510. The data value $D_{IN}$ is selected to generate the signals WSA and WSB as desired. A data value $D_{IN}$ having a logic high value will cause write access control transistor 511A to turn on and write access control transistor 512A to turn off, thereby writing a logic low value to memory cell 400A. Conversely, a data value $D_{IN}$ having a logic low value will cause write access control transistor 512A to turn on and write access control transistor 511A to turn off, thereby writing a logic high value to memory cell 400A. Memory cells 400B–400P are written in a similar manner.

The accessing of memory cells 400A–400P is summarized below in Table 1, which lists the memory cells which are accessed in response to different address signals A7–A0.

TABLE 1

| A7 | A6 | A5 | A4 | A3 | A2 | A1 | A0 | MEMORY CELL ACCESSED |
|---|---|---|---|---|---|---|---|---|
| 1 | 0 | 0 | 0 | 1 | 0 | 0 | 0 | 400A |
| 1 | 0 | 0 | 0 | 0 | 1 | 0 | 0 | 400B |
| 1 | 0 | 0 | 0 | 0 | 0 | 1 | 0 | 400C |
| 1 | 0 | 0 | 0 | 0 | 0 | 0 | 1 | 400D |
| 0 | 1 | 0 | 0 | 1 | 0 | 0 | 0 | 400E |
| 0 | 1 | 0 | 0 | 0 | 1 | 0 | 0 | 400F |
| 0 | 1 | 0 | 0 | 0 | 0 | 1 | 0 | 400G |
| 0 | 1 | 0 | 0 | 0 | 0 | 0 | 1 | 400H |
| 0 | 0 | 1 | 0 | 1 | 0 | 0 | 0 | 400I |
| 0 | 0 | 1 | 0 | 0 | 1 | 0 | 0 | 400J |
| 0 | 0 | 1 | 0 | 0 | 0 | 1 | 0 | 400K |
| 0 | 0 | 1 | 0 | 0 | 0 | 0 | 1 | 400L |
| 0 | 0 | 0 | 1 | 1 | 0 | 0 | 0 | 400M |
| 0 | 0 | 0 | 1 | 0 | 1 | 0 | 0 | 400N |
| 0 | 0 | 0 | 1 | 0 | 0 | 1 | 0 | 400O |
| 0 | 0 | 0 | 1 | 0 | 0 | 0 | 1 | 400P |

Although the invention has been described in connection with several embodiments, it is understood that this invention is not limited to the embodiments disclosed, but is capable of various modifications which would be apparent to one of ordinary skill in the art. For example, although the present invention has been described in connection with memory cells having first-level and second-level access transistors, it is understood that in other embodiments, other number of access levels can be used. Thus, in one variation, the first and second-level access transistors can be eliminated, with node N3 being connected directly to ground. Alternatively, the second-level access transistor can be eliminated, with the first-level access transistor being connected directly to node N3. In still other variations, additional levels (e.g., third-level, fourth-level, etc.) of access transistors can be provided. Thus, the invention is limited only by the following claims.

We claim:

1. A memory system comprising:
   a single-sided memory cell having a first node and a second node, wherein data values are written to the memory cell by selectively applying data signals to the first node or the second node, and wherein data values are read from the memory cell from the second node;
   a first voltage supply terminal for receiving a first supply voltage;
   a control circuit coupled to receive a data signal having one of a first state and a second state, wherein the control circuit couples the first node of the memory cell to the first voltage supply terminal when the data signal is in the first state, and wherein the control circuit couples the second node of the memory cell to the first voltage supply terminal when the data signal is in the second state.

2. The memory system of claim 1, wherein the first supply voltage is ground.

3. The memory system of claim 1, wherein only one of the first node and the second node is accessed at a given time.

4. The memory system of claim 1, wherein the control circuit comprises:
   a first transistor coupled between the first port and the first voltage supply terminal; and
   a second transistor coupled in parallel with the first transistor between the second port and the first voltage supply terminal.

5. The memory system of claim 4, wherein the control circuit further comprises one or more access transistors coupled between the first voltage supply terminal and the parallel connected first and second transistors, wherein the access transistors are coupled to receive address signals for addressing the memory cell.

6. The memory system of claim 5, wherein the access transistors are n-channel field effect transistors, and the first supply voltage is ground.

7. The memory system of claim 4, wherein the control circuit further comprises a control signal generator which generates a first control signal for turning on the first transistor and a second control signal for turning on the second transistor.

8. The memory system of claim 7, wherein the first control signal has a first state, which is the same state as the state of the data signal, and the second control signal has a second state, which is opposite the state of the data signal.

9. The memory system of claim 7, wherein the control circuit further comprises means for disabling the generation of the first and second control signals when the memory cell is not being addressed.

10. A memory system comprising:
    a single-sided memory cell having a first inverter cross-coupled with a second inverter, wherein an input terminal of the first inverter is coupled to an output terminal of the second inverter at a first node, and wherein an input terminal of the second inverter is coupled to an output terminal of the first inverter at a second node; and
    a control circuit for writing a data value to the memory cell by selectively applying a ground voltage to one and only one of the first and second nodes, wherein the control circuit connects the first node to a ground voltage supply terminal in response to an input data signal having a first logic state, thereby writing a data value having a first state to the memory cell, and wherein the control circuit connects the second node to the ground voltage supply terminal in response to an input data signal having a second logic state, thereby writing a data value having a second state to the memory cell.

11. A method of operating a single-sided memory cell, the method comprising the steps of:
    coupling a first node of the single-sided memory cell to a first voltage supply to write a data value having a first logical state to the single-sided memory cell; and
    coupling a second node of the single-sided memory cell to the first voltage supply to write a data value having a second logical state to the single-sided memory cell.

* * * * *